(12) United States Patent
Kwak et al.

(10) Patent No.: US 7,944,523 B2
(45) Date of Patent: May 17, 2011

(54) LIQUID CRYSTAL DISPLAY DEVICE COMPRISING A FIRST CONDUCTIVE ADHESIVE MEMBER ARRANGED ON THE FIRST CONNECTOR TO CONNECT THE FIRST CONNECTOR TO THE SHIELD CASE

(75) Inventors: Choong-Yull Kwak, Uijengbu-si (KR); Jae-Ho Jung, Cheonan-si (KR); Dong-Sung Im, Asan-si (KR); Sang-Won Lee, Suwon-si (KR)

(73) Assignee: Samsung Electronics Co.,Ltd., Suwon-si (KR)

( * ) Notice: Subject to any disclaimer, the term of this patent is extended or adjusted under 35 U.S.C. 154(b) by 85 days.

(21) Appl. No.: 11/772,498

(22) Filed: Jul. 2, 2007

(65) Prior Publication Data
US 2008/0123016 A1 May 29, 2008

(30) Foreign Application Priority Data
Jul. 4, 2006 (KR) .................. 10-2006-0062422

(51) Int. Cl.
G02F 1/1333 (2006.01)
G02F 1/1345 (2006.01)
H05K 9/00 (2006.01)
H01R 13/648 (2006.01)
H01R 4/66 (2006.01)

(52) U.S. Cl. ............ 349/59; 349/40; 349/149; 361/818; 439/95

(58) Field of Classification Search .................. 349/59, 349/40; 361/818; 439/95
See application file for complete search history.

(56) References Cited

U.S. PATENT DOCUMENTS

| | | | | |
|---|---|---|---|---|
| 6,034,757 A | * | 3/2000 | Yanagawa et al. | 349/141 |
| 6,049,468 A | * | 4/2000 | Learmonth | 361/816 |
| 6,074,223 A | * | 6/2000 | Huang | 439/95 |
| 6,534,722 B2 | * | 3/2003 | Takaoka | 174/254 |
| 6,600,536 B1 | * | 7/2003 | Kuwabara et al. | 349/117 |
| 6,665,025 B2 | * | 12/2003 | Lee | 349/59 |
| 2003/0011736 A1 | * | 1/2003 | Ha et al. | 349/149 |
| 2004/0252254 A1 | * | 12/2004 | Koo et al. | 349/58 |
| 2005/0052858 A1 | * | 3/2005 | Shima | 361/814 |
| 2005/0078446 A1 | * | 4/2005 | Bae | 361/687 |
| 2005/0083447 A1 | | 4/2005 | Yu | |
| 2005/0088809 A1 | * | 4/2005 | Nakagawa et al. | 361/681 |
| 2006/0249301 A1 | * | 11/2006 | Meth | 174/259 |

FOREIGN PATENT DOCUMENTS

| | | |
|---|---|---|
| JP | 2002-333606 | 11/2002 |
| KR | 10-2000-0060193 | 10/2000 |
| KR | 10-2004-0022880 | 3/2004 |
| KR | 10-2006-0025005 | 3/2006 |

* cited by examiner

*Primary Examiner* — Brian M. Healy
*Assistant Examiner* — Dennis Y Kim
(74) *Attorney, Agent, or Firm* — H.C. Park & Associates, PLC

(57) ABSTRACT

The present invention provides a liquid crystal display device capable of protecting a printed circuit board from electromagnetic interference. The LCD device of the present invention includes a LCD panel for presenting an image, a backlight assembly for illuminating light to the LCD panel, a bottom chassis for securing the LCD panel and the backlight assembly, a first printed circuit board seated on a rear surface of the bottom chassis for generating signals to be supplied to the LCD panel on the basis of externally input signals, a first connector coupled with a signal transfer film which provides the input signal of the first printed circuit board, a shield case made of a conductive material for protecting an upper surface of the first printed circuit board, and a first conductive adhesive member interposed between the first connector and the shield case for discharging an electromagnetic wave from the first connector to the shield case.

13 Claims, 7 Drawing Sheets

LIQUID CRYSTAL DISPLAY DEVICE COMPRISING A FIRST CONDUCTIVE ADHESIVE MEMBER ARRANGED ON THE FIRST CONNECTOR TO CONNECT THE FIRST CONNECTOR TO THE SHIELD CASE

CROSS-REFERENCE TO RELATED APPLICATION

This application claims priority from and the benefit of Korean Patent Application No. 10-2006-0062422, filed on Jul. 4, 2006, which is hereby incorporated by reference for all purposes as if fully set forth herein.

BACKGROUND OF THE INVENTION

1. Field of Invention

The present invention relates to a liquid crystal display (LCD) device and, in particular, to a LCD device capable of protecting a printed circuit board from electromagnetic wave interference (EMI).

2. Description of the Background

Typically, a LCD device includes a LCD panel presenting images, a backlight assembly supplying light to the LCD panel, and a driving circuit generating signals for driving the LCD panel.

The driving circuit includes a gate driver, a data driver, a timing controller, and a driving voltage generator.

The timing controller and the driving voltage generator may be installed on a printed circuit board (PCB) and provide control signals and driving voltages to the gate driver and the data driver, respectively.

The gate driver and the data driver may be formed as integrated circuits (ICs). They may be connected to the LCD panel on a film in the form of a tape carrier package (TCP) or installed directly on the LCD panel.

When externally supplied pixel data flows into the timing controller, EMI may occur. The EMI distorts the signals generated by the timing controller, resulting in driving failure of the LCD device.

SUMMARY OF THE INVENTION

This invention provides a LCD device that may be capable of avoiding an occurrence of EMI on a PCB by applying a conductive adhesive member. The conductive adhesive member connects the PCB to a bottom chassis and a shield case and discharges the EMI to ground via the shield case, canceling out the interference produced by the electromagnetic wave.

Additional features of the invention will be set forth in the description which follows, and in part will be apparent from the description, or may be learned by practice of the invention.

In order to achieve the above object, the liquid crystal display device of the present invention includes a liquid crystal display device including a liquid crystal display panel; a backlight assembly to supply light to the liquid crystal display panel; a bottom chassis securing the liquid crystal display panel and the backlight assembly; a first printed circuit board arranged on a rear surface of the bottom chassis to generate signals to be supplied to the liquid crystal display panel; a first connector to supply an input signal to the first printed circuit board; a shield case comprising a conductive material, the shield case being arranged on an upper surface of the first printed circuit board; and a first conductive adhesive member arranged between the first connector and the shield case, wherein the first conductive adhesive member discharges an electromagnetic wave from the first connector to the shield case.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention, and together with the description serve to explain the principles of the invention.

DETAILED DESCRIPTION OF ILLUSTRATED EMBODIMENTS

Figure 1:
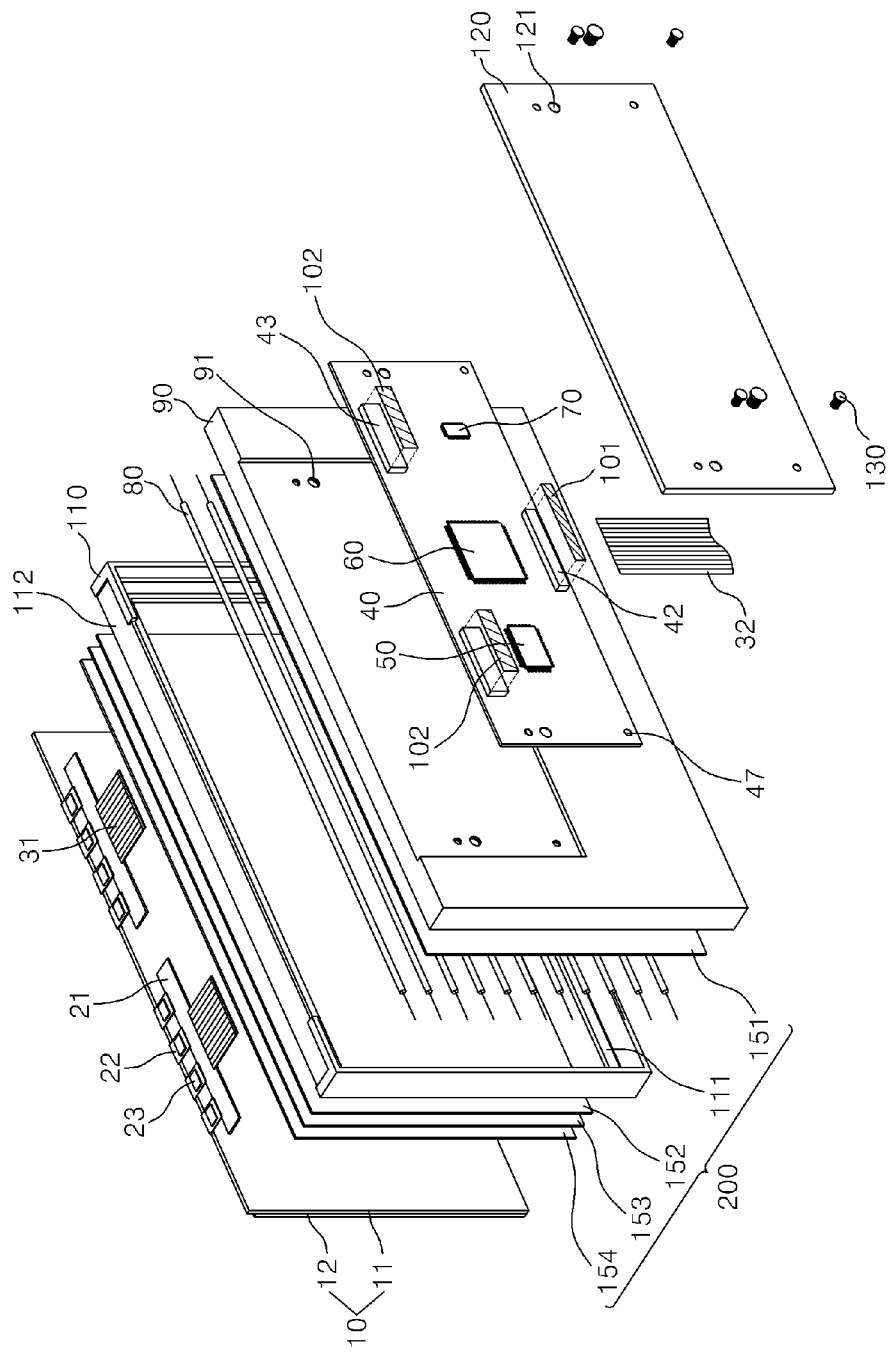
FIG. 1 is an exploded perspective view showing a disassembled LCD device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative size of layers and regions may be exaggerated for clarity. Like reference numerals in the drawings denote like elements.

It will be understood that when an element such as a layer, film, region or substrate is referred to as being "on", "connected to", or "coupled to" another element or layer, it can be directly on, directly connected to, or directly coupled to the other element or layer, or intervening elements or layers may also be present. In contrast, when an element is referred to as being "directly on", "directly connected to", or "directly coupled to" another element or layer, there are no intervening elements or layers present.

FIG. 1 is an exploded perspective view showing a disassembled LCD device according to an exemplary embodiment of the present invention.

Referring to FIG. 1, the LCD device includes a LCD panel 10 for presenting images, a backlight assembly 200 for illuminating the LCD panel 10, a bottom chassis 90 for securing the LCD panel 10 and the backlight assembly 200, a control PCB 40 mounted on a rear surface of the bottom chassis 90, a first connector 42 coupled to a second signal transmission film 32, which inputs signals to the control PCB 40, a shield case 120 for covering the control PCB 40 and a first conductive adhesive member 101 interposed between the first connector 42 and the shield case 120. The shield case 120 may be comprised of conductive material. The first conductive adhesive member 101 may be formed with a double-sided aluminum tape or an anisotropic conductive film (ACF).

The LCD panel 10 is formed by attaching a thin film transistor substrate 11 with a color filter substrate 12 with a liquid crystal interposed therebetween. The LCD panel 10 includes a liquid crystal cell which is independently driven by a thin film transistor (TFT). The TFT supplies a pixel signal to the liquid crystal cell through a data line in response to a scan signal from a gate line.

The thin film transistor substrate 11 includes a gate driver and a data driver for driving the gate lines and the data lines, respectively. The gate driver may be formed with an amorphous silicon (a-Si) TFT or a poly silicon (p-Si) TFT on the thin film transistor substrate 11.

The gate driver may provide sequential scan signals of gate-on voltages to the gate lines. Also, the gate driver provides the gate lines with a gate-off voltage, except when the gate-on voltage is provided.

The data driver is connected to the data PCB 21 through a data TCP 22 on which the data driving circuit 23 is mounted. The data driving circuit 23 converts the pixel data into analog pixel signals and provides the analog pixel signals to the data lines. The data PCB 21 provides control signals, voltage signals, and pixel data from a timing controller 60 and a driving voltage generator 50 to corresponding driving circuits.

For a large LCD device, the timing controller 60 and the driving voltage generator 50 may be formed on a separate PCB, i.e. a control PCB 40 connected to the data PCB 21. In this case, the data PCB 21 is connected to the data TCP 22 and the control PCB 40 via a first signal transfer film 31. Accordingly, the data PCB 21 may supply the control signals, the voltage signals, and the pixel data generated by the timing controller 60 and the driving voltage generator 50 mounted on the control PCB 40.

In order to illuminate the LCD panel 10, an edge type backlight assembly or a direct type backlight assembly may be used. The edge type backlight assembly and direct type backlight assembly are classified according to the position of the light source with respect to the display panel. In this exemplary embodiment, the direct type backlight assembly is used.

The direct type backlight assembly 200 includes a light source 80 and optical films of a diffusion sheet 152 for evenly diffusing the light emitted from the light source 80 and a prism sheet 153 for effectively scattering the light. The direct type backlight assembly 200 also includes a reflection sheet 151 for reflecting backward the emitted light toward the front LCD panel 10.

A plurality of lamps, a light emitting diode, and a surface-shaped light source may be used as the light source 80. In this exemplary embodiment, the light source 80 is a plurality of lamps horizontally arranged. The plurality of lamps 80 is fixedly supported by lamp holders which supply power to the lamps 80. The diffusion sheet 152 is arranged over the lamps 80 for preventing the lamps 80 from forming bright lines and dark lines.

The diffusion sheet 152 also diffuses light emitted from the lamps 80 for removing the bright lines and the dark lines. The luminance of diffused light decreases due to the degraded utility factor. In order to increase light luminance, the prism sheet 153 is arranged over the diffusion sheet 152. Further, a protection sheet 154 is arranged over the optical sheets, such as the diffusion sheet 152 and the prism sheet 153.

The backlight assembly 200 is fixedly mounted in the bottom chassis 90. The bottom chassis 90 includes a mounting bay for positioning the backlight assembly 200. The bottom chassis 90 may be made of metallic material for protecting the backlight assembly 200 and the LCD panel 10 positioned on the upper surface of the backlight assembly.

After being sequentially mounted in the mounting bay of the bottom chassis 90, the reflection sheet 151, the light source 80, and the optical sheets 152 and 153 are fixed along exterior walls of the bottom chassis 90 by means of a mould frame 110.

The mould frame 110 includes a panel positioning part 111 in which the LCD panel 10 is positioned and a data PCB groove 112 formed on one outside wall such that the data PCB 21 is fixed therein. When the LCD panel 10 is seated in the panel positioning part 111, the data PCB 21 is connected to the panel positioning part 111 and the data TCP 22 is fixed in the data PCB groove 112. The control PCB 40 is connected to the data PCB 21 and the first signal transfer film 31 is mounted on the rear surface of the bottom chassis 90.

In order to protect the control PCB 40, a shield case 120 covers the upper surface of the control PCB 40.

The shield case 120 protects the electric devices, such as the driving voltage generator 50, the timing controller 60, and the memory 70 from physical and electrical impacts. For this purpose, the shield case 120 may be made of metallic material.

Figure 2:
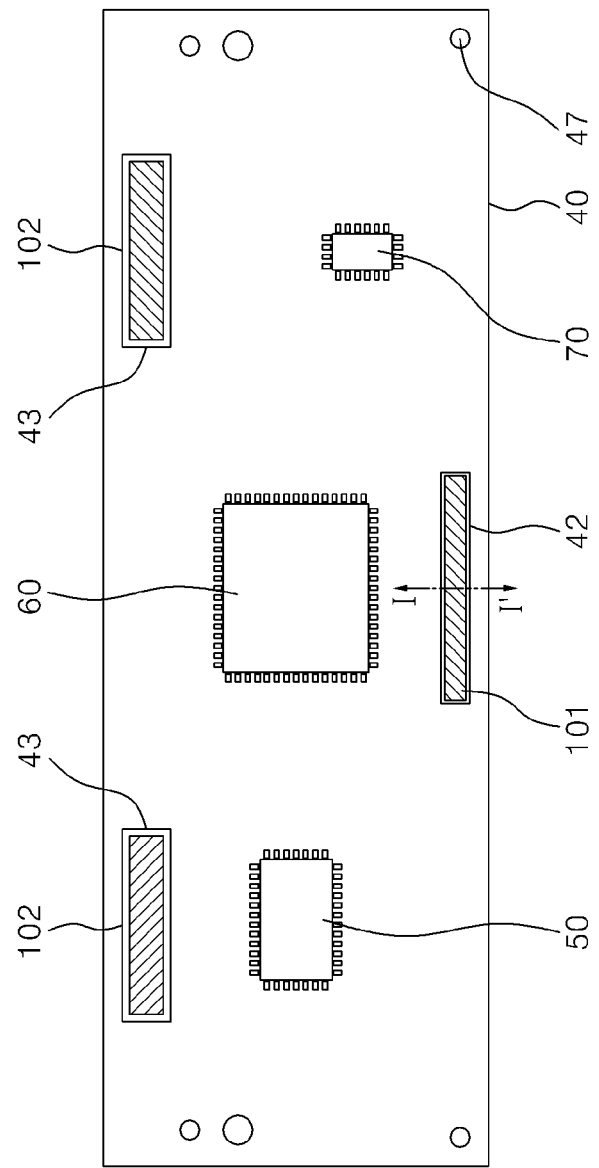
FIG. 2 is a top plan view showing a control PCB of the LCD device of FIG. 1.
Figure 3:
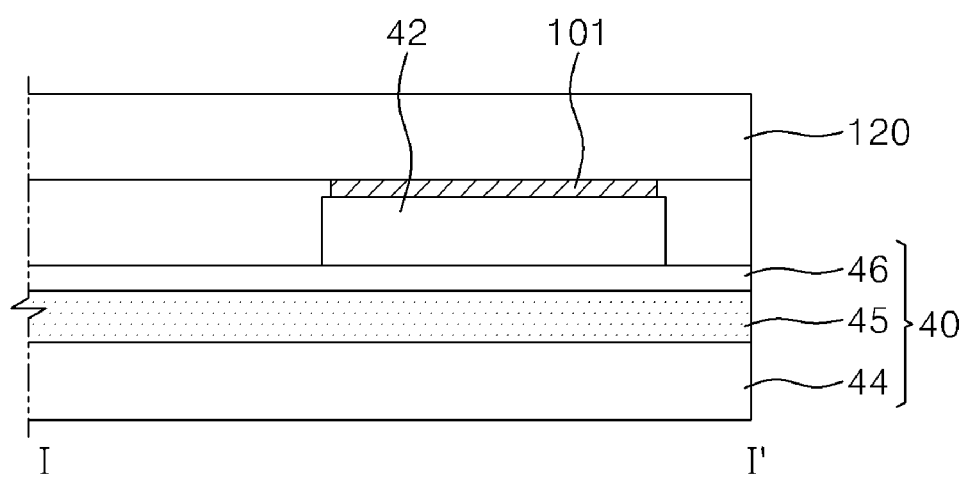
FIG. 3 is a cross-sectional view taken along line I-I' of FIG. 2.

FIG. 2 is a top plan view showing a control PCB of the LCD device of FIG. 1, and FIG. 3 is a cross-sectional view taken along line I-I' of FIG. 2.

Referring to FIG. 2 and FIG. 3, the control PCB 40 is formed by sequentially depositing a signal transfer layer 45 having signal lines formed by patterning a thin metal film thereon and a protection film 46 for protecting the signal transfer layer 45 on a substrate 44. The control PCB 40 also may be formed by depositing the aforementioned structured PCBs. The control PCB 40 further includes the driving voltage generator 50, the timing controller 60, and the memory 70 mounted on the upper surface of the protection film 46.

The driving voltage generator 50 generates gate-on voltage and gate-off voltage to be supplied to the gate driving circuit and analog driving voltage to be supplied to the data driving circuit 23. The timing controller 60 generates control signals, such as a start pulse, a shift clock, and an output control signal, to be transmitted to the gate driving circuit and the data driving circuit 23. The timing controller 60 also provides the externally input image signals to the data driving circuit 23.

The memory 70 stores previous frame data received from the timing controller 60 and provides the previous frame data to the timing controller 60 when a present frame data is provided to the timing controller 60. The control PCB 40 includes a first connector 42 coupled to the second signal transfer film 32, which provides externally input image signals, and a second connector 43 coupled to the first signal transfer film 31, which transmits the control signals, the voltage signals, and the pixel data generated by the control PCB 40 to the data PCB 21.

On the basis of the pixel data and the voltage signals, the voltage generator 50 and the timing controller 60 generate the voltage signals and control signals to be transmitted to the driving ICs and provide the generated voltage signals and control signals to the data PCB 21 through the first signal transfer film 31. The first signal transfer film 31 is connected to the data PCB 21 and inserted into the second connector 43 mounted on the control PCB 40. The second signal transfer film 32 is connected to an external power source and a graphic controller (not shown) and inserted into a first connector 42 mounted on the control PCB 40.

The first and second signal transfer films 31 and 32 may be formed with flexible PCBs formed by sequentially depositing signal lines of thin metal films, contact pads, and protection films on a base film.

Through the second signal transfer film 32 inserted into the first connector 42, image data signals from an exterior device may be input using a Low Voltage Differential Signaling (LVDS) technique. The LVDS may support serial data transmission at 1000 Mbps and is less susceptible to common mode noise. However, when the LVDS signal is input into the first connector 42, EMI may be generated. In this exemplary embodiment of the present invention, the connection of the first connector 42 to the shield case 120 through the first conductive adhesive member 101 cancels the EMI. That is, the first conductive adhesive member 101 is interposed between the first connector 42 and the shield case 120 to electrically connect the first connector 42 and the shield case 120. In this manner, the shield case 120 grounds the first connector 42, such that the electromagnetic wave caused by the LVDS signal may be discharged through the first conductive adhesive member 101 and the shield case 120, resulting in cancellation of EMI to the control PCB 40.

Also, a second conductive adhesive member 102 is arranged on the second connector 43 in the same manner, preventing EMI from affecting the data PCB 21. The second conductive adhesive member 102 may be formed with a double-sided aluminum tape or an ACF.

Accordingly, the first and second conductive adhesive members 101 and 102 and the shield case 120 discharge the electromagnetic waves caused by the pixel data signals, control signals, and the voltage signals, thereby preventing EMI generated at the control PCB 40 from transmitting to the data driving circuit 23 and the LCD panel 10.

In order to improve grounding abilities of the first and second connectors 42 and 43, the shield case 120 may be electrically connected to the bottom chassis 90. Accordingly, the bottom chassis 90 and the shield case 120 are provided with a plurality of penetration holes 91 and 121, respectively, such that screws 130 inserted through penetration holes 91 and 121 may tighten the bottom chassis 90 to the shield case 120.

Also, the control PCB 40 is provided with a plurality of penetration holes 47 corresponding to the penetration holes 91 and 121 of the bottom chassis 90 and the shield case 120 to secure the control PCB 40 on the rear surface of the bottom chassis 90. As described above, the shield case 120 and the bottom chassis 90 may be used as a grounding means because they are electrically connected to one another.

As described above, the LCD device according to an exemplary embodiment of the present invention provides first and second conductive adhesive members 101 and 102 that electrically connect the bottom chassis 90 to the shield case 120 to form a grounding means, whereby the EMI caused by externally supplied signals and generated by signals from the control PCB 40 to the data PCB 21 may be cancelled. Accordingly, the LCD device may prevent the externally supplied signals input to the control PCB 40 from being distorted, resulting in prevention of LCD panel failure.

Figure 4:
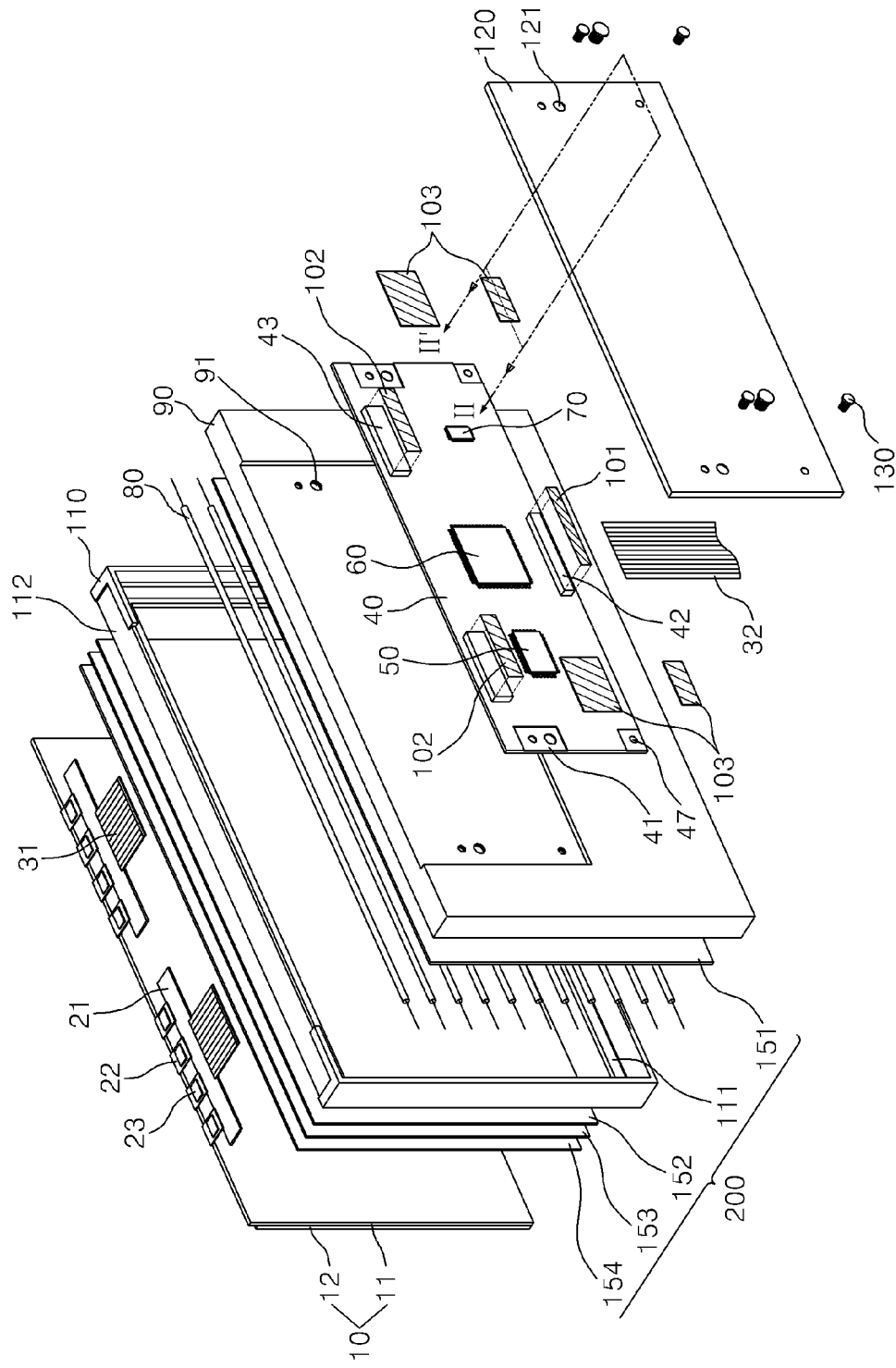
FIG. 4 is an exploded perspective view showing a disassembled LCD device according to a second exemplary embodiment of the present invention.
Figure 5:
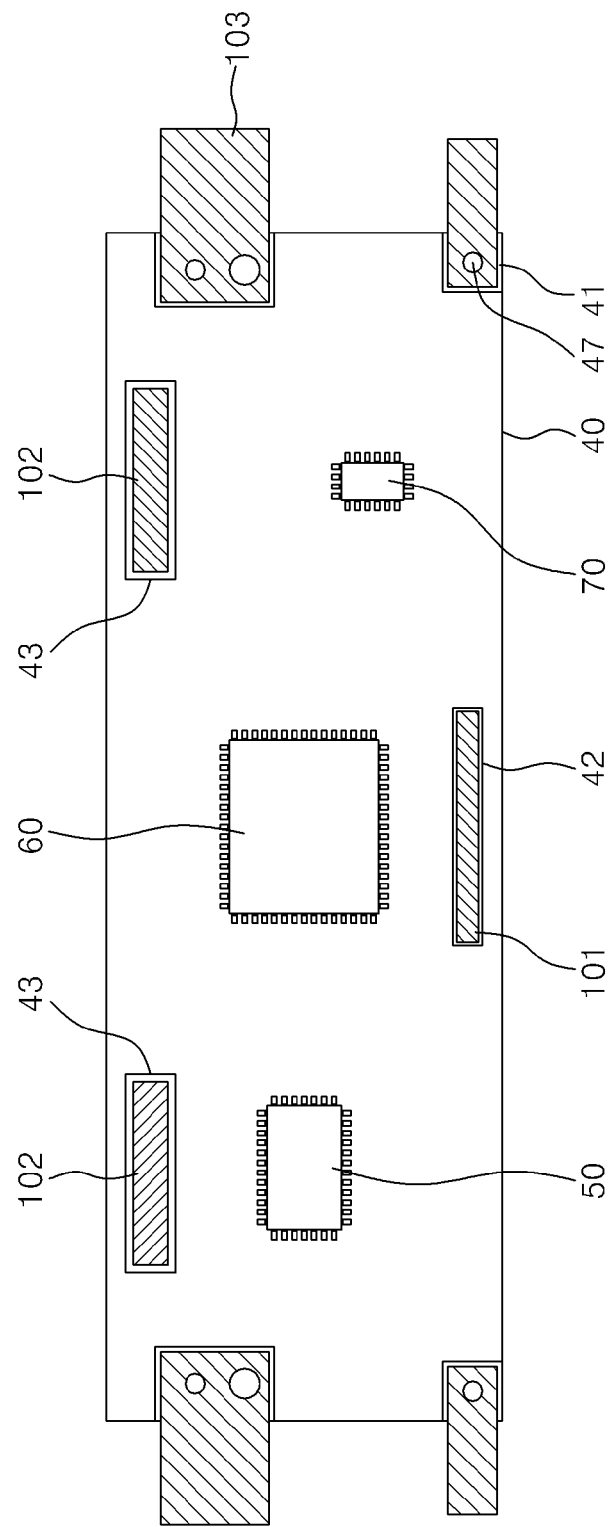
FIG. 5 is a top plan view showing a control PCB of the LCD device of FIG. 4.
Figure 6:
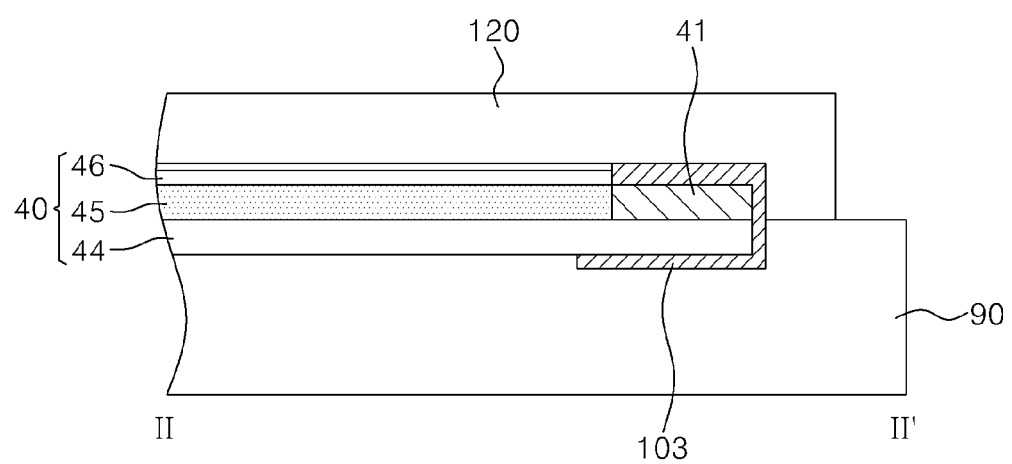
FIG. 6 is a cross-sectional view taken along line II-II' of FIG. 4.

FIG. 4 is an exploded perspective view showing a disassembled LCD device according to an exemplary embodiment of the present invention, FIG. 5 is a top plan view showing a control PCB of the LCD device of FIG. 4, and FIG. 6 is a cross-sectional view taken along line II-II' of FIG. 4.

In comparison with the LCD device of FIG. 1, the structure of the LCD device of FIG. 4 is identical with that of FIG. 1, except that the control PCB 40 includes ground electrodes 41 and third conductive adhesive members 103 connected to at least one of the bottom chassis 90 and the shield case 120.

Referring to FIG. 4, FIG. 5, and FIG. 6, the control PCB 40 further includes at least one ground electrode 41 and at least one third conductive adhesive member 103 connecting the ground electrode 41 to at least one of the bottom chassis 90 and the shield case 120. In this exemplary embodiment, the control PCB 40 includes four (4) ground electrodes 41; however, a number and size of the ground electrodes may be modified according to a size of the control PCB 40 and a design of inner signal lines for the control PCB 40.

The signals exchanged between the timing controller 60 and the memory 70 mounted on the control PCB 40 include high frequency components, which induces EMI. The electromagnetic waves interfere with the control signals, voltage signals, and image data signals. In order to prevent the EMI, the control PCB 40 is provided with at least one ground electrode 41 connected to ground terminals of the timing controller 60, memory 70, and driving voltage generator 50.

The connection terminals formed at the driving voltage generator 50, timing controller 60, and the memory 70 are mounted to the control PCB 40 and penetrate the protection film 46 to connect to corresponding signal lines on the signal transfer layer 45. Inner circuits of the driving voltage generator 50, timing controller 60, and the memory 70 commonly connect grounding signal lines of the signal transfer layer 45 to the ground electrode 41 formed on the control PCB 40. The ground electrodes 41 are formed on the signal transfer layer 45 which is patterned inside the protection film 46 of the control PCB 40. The ground electrode 41 is formed on the front or rear surface of the control PCB 40 and at least one ground electrode 41 is externally exposed to connect to the third conductive adhesive member 103. Hence, the ground electrode 41 is exposed by removing the protection film 46 formed above the ground electrode 41 for connecting the ground electrode 41 to the third conductive adhesive member 103 because the ground electrode is formed inside the protection film 46. The exposed ground electrode 41 is electrically connected to the bottom chassis 90 through the third conductive adhesive member 103, as shown in FIG. 5 and FIG. 6.

One surface of the third conductive adhesive member 103 contacting the ground electrode 41 is bent along an edge of the control PCB 40 to contact the rear surface of the control PCB 40. Another surface of the ground electrode 41 contacts the bottom chassis 90. The third conductive adhesive member 103 may be formed with an ACF or an aluminum tape including an adhesive on both surfaces of the third conductive adhesive member 103.

Figure 7:
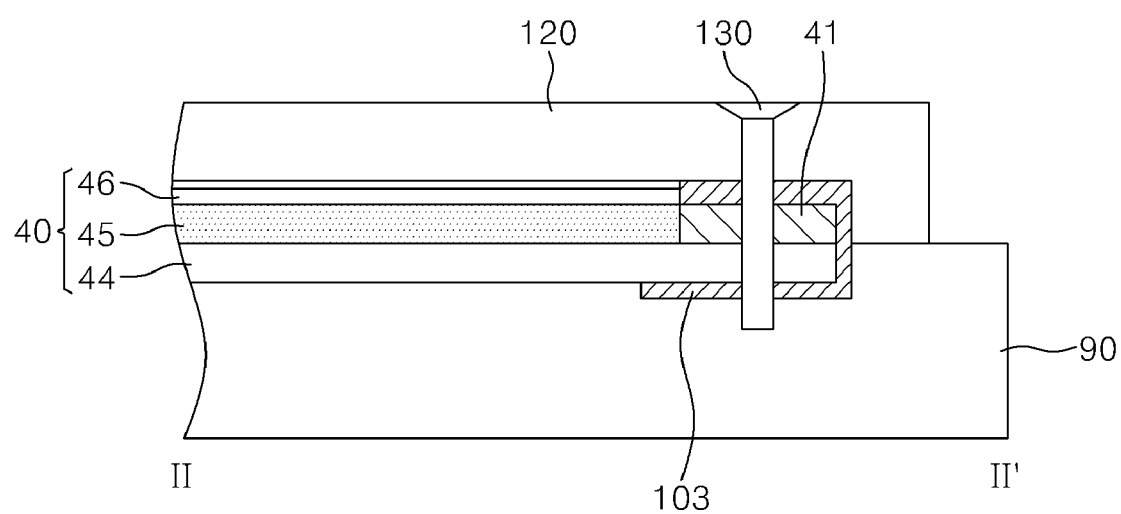
FIG. 7 is a cross-sectional view taken along line II-II' of FIG. 4 when a screw is fastened.

FIG. 7 is a cross-sectional view along line II-II' of FIG. 4 when a screw is fastened.

Referring to FIG. 7, the shield case 120, the control PCB 40, and the bottom chassis 90 are fixedly coupled to one another by screw 130. As shown in FIG. 7, the screw 130 sequentially penetrates and tightly couples the bottom chassis 90, control PCB 40, and shield case 120 together. For this purpose, the bottom chassis 90, control PCB 40, and shield case 120 are provided with penetration holes 91, 47, and 121, respectively.

The penetration holes 47 of the control PCB 40 are arranged to penetrate the ground electrode 41.

By forming the penetration hole 47 through the ground electrode 41, the shield case 120, the ground electrode 41, the third conductive adhesive member 103, and the bottom chassis 90 may be connected together by screw 130, thereby preventing the bottom chassis 90 from separating from the ground electrode 41 by external impact to the LCD device.

Accordingly, the screw 130 may be made of conductive material such as a metal. The screw 130 made of the conductive material electrically connects the shield case 120 to the bottom chassis 90. Accordingly, the shield case 120 functions as a grounding means canceling the EMI.

The ground electrode 41 may be connected to the bottom chassis 90 through the third conductive adhesive member 103 by removing the substrate 44 of the control PCB 40.

Also, the ground electrode 41 may be exposed by removing the protection film 46 formed on the upper surface of the control PCB 40 or the substrate 44 of the control PCB 40, such that the exposed ground electrode 41 is connected to the shield case 120 through the third conductive adhesive member 103. Accordingly, the ground electrode 41 is electrically connected to the bottom chassis 90 and the shield case 120 to increase the grounding area, resulting in effective reduction of the EMI.

The present invention may also apply to flat panel display devices, such as a plasma display device and an organic electroluminescence display device.

As described above, the LCD device of the present invention electrically connects the connectors of the PCB to the shield case for securing the PCB through a novel conductive adhesive member, whereby the electromagnetic wave induced by the signal supplied to the PCB from outside is discharged through the conductive adhesive member and the shield case, resulting in cancellation of EMI.

Also, the LCD device of the present invention electrically connects the ground electrode 41 of the PCB to the bottom chassis 90 by means of a conductive adhesive member 103, whereby the bottom chassis 90 discharges the electromagnetic wave induced from the PCB to cancel the interference caused by the electromagnetic wave.

Also, the LCD device of the present invention provides a cost effective, simplified fabrication process for preventing EMI and for minimizing the driving failure of a LCD device caused by electrostatic discharge.

Although exemplary embodiments of the present invention have been described in detail hereinabove, it should be clearly understood that many variations and/or modifications of the basic inventive concepts taught herein, which may appear to those skilled in the present art, will still fall within the spirit and scope of the present invention. Thus, it is intended that the present invention cover the modifications and variations of this invention provided they come within the scope of the appended claims and their equivalents.

What is claimed is:

1. A liquid crystal display device, comprising:
    a liquid crystal display panel;
    a backlight assembly to supply light to the liquid crystal display panel;
    a bottom chassis securing the liquid crystal display panel and the backlight assembly;
    a first printed circuit board arranged on a rear surface of the bottom chassis to generate signals to be supplied to the liquid crystal display panel;
    a first connector disposed on a surface of the first printed circuit board to supply an input signal to the first printed circuit board;
    a second printed circuit board connected to the first printed circuit board and the liquid crystal display panel through a signal transfer film, the signal transfer film being inserted into the first connector;
    a shield case comprising a conductive material, the shield case being arranged on an upper surface of the first printed circuit board; and
    a first conductive adhesive member arranged on the first connector to connect the first connector to the shield case,
    wherein a surface of the first conductive adhesive member is in contact with the first connector, a rear surface of the first conductive adhesive member is in contact with the shield case, and the first conductive adhesive member discharges an electromagnetic wave from the first connector to the shield case.

2. The liquid crystal display device of claim 1, further comprising
    a second connector coupled with the signal transfer film to supply signals from the first printed circuit board to the second printed circuit board.

3. The liquid crystal display device of claim 2, further comprising a second conductive adhesive member arranged between the second connector and the shield case to discharge an electromagnetic wave from the second connector to the shield case.

4. The liquid crystal display device of claim 3, wherein the first conductive adhesive member and the second conductive adhesive member each comprise a double-sided aluminum tape.

5. The liquid crystal display device of claim 3, wherein the first conductive adhesive member and the second conductive adhesive member each comprise an anisotropic conductive film.

6. The liquid crystal display device of claim 3, further comprising a screw, wherein the screw couples the bottom chassis, the first printed circuit board, and the shield case.

7. The liquid crystal display device of claim 6, wherein the screw comprises a metallic material.

8. The liquid crystal display device of claim 3, further comprising a ground electrode arranged on a surface of the first printed circuit board, the ground electrode being connected to at least one of the shield case and the bottom chassis.

9. The liquid crystal display device of claim 8, further comprising a third conductive adhesive member arranged between the ground electrode and the at least one of the bottom chassis and the shield case, wherein the third conductive adhesive member connects the ground electrode to the at least one of the shield case and the bottom chassis.

10. The liquid crystal display device of claim 9, further comprising a screw, wherein the screw couples the bottom chassis, the first printed circuit board, and the shield case by penetrating the ground electrode, the third conductive adhesive member, the bottom chassis, and the shield case.

11. The liquid crystal display device of claim 10, wherein the screw comprises a metallic material.

12. The liquid crystal display device of claim 10, wherein the third conductive adhesive member comprises a double-sided aluminum tape.

13. The liquid crystal display device of claim 10, wherein the third conductive adhesive member comprises an anisotropic conductive film.

* * * * *